United States Patent
Takano et al.

[11] Patent Number: 6,120,749
[45] Date of Patent: Sep. 19, 2000

[54] SILICON SINGLE CRYSTAL WITH NO CRYSTAL DEFECT IN PERIPHERAL PART OF WAFER AND PROCESS FOR PRODUCING THE SAME

[75] Inventors: Kiyotaka Takano; Makoto Iida; Eiichi Iino; Masanori Kimura; Hirotoshi Yamagishi, all of Gunma-ken, Japan

[73] Assignee: Shin-Etsu Handotai Co., Ltd, Tokyo, Japan

[21] Appl. No.: 09/101,941

[22] PCT Filed: Jan. 17, 1997

[86] PCT No.: PCT/JP97/00090

§ 371 Date: Jul. 17, 1998

§ 102(e) Date: Jul. 17, 1998

[87] PCT Pub. No.: WO97/26393

PCT Pub. Date: Jul. 24, 1997

[30] Foreign Application Priority Data

Jan. 19, 1996 [JP] Japan ................................. 8-025928

[51] Int. Cl.[7] .......................... C30B 29/06; C31B 33/00
[52] U.S. Cl. ...................... 423/348; 257/610; 257/611; 257/913; 423/325
[58] Field of Search ..................... 428/450, 689, 428/700, 702, 446, 620, 641; 117/13, 14, 15, 35, 2; 257/535, 610, 611, 617, 913; 423/325, 348

[56] References Cited

U.S. PATENT DOCUMENTS

| | | | |
|---|---|---|---|
| 5,248,378 | 9/1993 | Oda et al. | 156/617.1 |
| 5,487,354 | 1/1996 | Von Ammon et al. | 117/113 |
| 5,575,847 | 11/1996 | Kuramouchi et al. | 117/210 |
| 5,728,211 | 3/1998 | Takano et al. | 117/14 |
| 5,834,322 | 11/1998 | Fusegawa et al. | 438/12 |

FOREIGN PATENT DOCUMENTS

| | | |
|---|---|---|
| 0 503 816 | 9/1992 | European Pat. Off. . |
| 0 504 837 | 9/1992 | European Pat. Off. . |
| 0 536 958 | 4/1993 | European Pat. Off. . |
| 0 747 513 | 12/1996 | European Pat. Off. . |
| 4442239 | 6/1995 | Germany . |
| 4414947 | 8/1995 | Germany . |
| 2267195 | 10/1990 | Japan . |
| 6279188 | 3/1993 | Japan . |
| 656588 | 3/1994 | Japan . |
| 794543 | 3/1995 | Japan . |

OTHER PUBLICATIONS

Ryuta, et al. "Effect of Crystal Pulling Rate on Formation of Crystal–Originated 'Particles' on Si Wafers," Japanese Journal Of Applied Physics, Part 2, 31 (1992) Mar. 15, No. 3b, Tokyo, pp. L293–L295.

Winkler, et al. "Improvement of the Gate Oxide Integrity by Modifying Crystal Pulling and Its Impact on Device Failures," J. Electrochem. Soc., vol. 141, No. 5, May 1994, pp. 1398–1401.

*Primary Examiner*—Deborah Jones
*Assistant Examiner*—Stephen Stein
*Attorney, Agent, or Firm*—Hogan & Hartson LLP

[57] ABSTRACT

A silicon single-crystal wafer having a diameter of 6 inches or larger and improved in the dielectric breakdown strength of oxide film especially in a peripheral part thereof is provided to thereby heighten the yield of device chips produced per wafer. This wafer has no crystal defects with regard to the dielectric breakdown strength of oxide film in its peripheral region which extends from the circumference and accounts for up to 50% of the total area, in particular which extends from the circumference to a circle 30 mm apart from the circumference. A process for producing a silicon single crystal for easily producing, by the Czochralski method, a silicon single-crystal wafer improved in the dielectric breakdown strength of oxide film especially in a peripheral part thereof without considerably lowering the production efficiency is provided. In this process, the silicon single crystal which is being grown by the Czochralski method is pulled at a rate which is 80 to 60% of the critical pull rate inherent in the pulling apparatus.

2 Claims, 4 Drawing Sheets

SILICON SINGLE CRYSTAL WITH NO CRYSTAL DEFECT IN PERIPHERAL PART OF WAFER AND PROCESS FOR PRODUCING THE SAME

TECHNICAL FIELD

The present invention relates to a technique for easily producing, by the Czochralski method, a silicon single crystal improved in the dielectric breakdown strength of oxide film in the peripheral part of a wafer without considerably lowering production efficiency.

BACKGROUND ART

Along with a recent tendency to increase the degree of integration of semiconductor circuits, elements have been becoming finer; thus, an insulating oxide film in the gate electrode portion of an MOS-LSI is becoming thinner. Even such a thin insulating oxide film is required to have a high dielectric breakdown strength and a small leakage current during operation of a device element, i.e. to have a high degree of reliability.

In this connection, a silicon wafer produced from a silicon single crystal which is produced by the Czochralski method (hereinafter referred to as the CZ method) is known to be significantly low in the dielectric breakdown strength of oxide film as compared to a wafer produced from a silicon single crystal produced by the floating zone method (the FZ method), or an epitaxial wafer produced by growth of a thin silicon single-crystal film on a wafer produced by the CZ method (Mitsumasa Koyanagi, "Submicron Devices II, 3-Reliability of Gate Oxide Film" Maruzen Co., Ltd., p70).

A crystal defect introduced during growth of a silicon single crystal according to the CZ method is known to be responsible for a degradation in the dielectric breakdown strength of oxide film. It is also known that through employment of a significantly low crystal growth rate (for example, 0.4 mm/min or lower), the dielectric breakdown strength of oxide film of a silicon single crystal produced by the CZ method can be significantly improved (for example, Japanese Patent Laid-Open (kokai) No. 2-267195).

When the rate of crystal growth is decreased from a conventional rate not lower than 1 mm/min to a rate of 0.4 mm/min or lower for improving the dielectric breakdown strength of oxide film, the dielectric breakdown strength of oxide film will be improved. However, the production efficiency of single crystals will become half or less, resulting in significant increase in cost.

In this connection, according to the conventional production of a silicon single crystal by the CZ method, in order to maximize the production efficiency of a single crystal, a single crystal is pulled at or near the critical rate inherent in the individual pulling apparatus. In a wafer produced from the thus-grown single-crystal ingot, defects are distributed in the wafer surface at a relatively uniform density from the central part to the peripheral part. Accordingly, when, for example, about 100 device chips are to be produced from a single wafer, the yield is similar between the central part of the wafer and the peripheral part of the wafer; i.e., failure rate is substantially uniform over the wafer surface.

As mentioned previously, in order to improve the dielectric breakdown strength of oxide film over the entire surface of a wafer, a single crystal must be pulled at a significantly low rate. In a single wafer, since a peripheral part thereof occupies a relatively large area, the yield of device chips from the wafer depends on yield from the peripheral part.

Accordingly, in order to improve the yield of device chips from a silicon single-crystal wafer, the dielectric breakdown strength of oxide film must be improved in the peripheral part of the wafer.

The present invention has been accomplished in view of the above-mentioned problems, and an object of the present invention is to easily produce, by the Czochralski method, a silicon single-crystal improved in the dielectric breakdown strength of oxide film especially in a peripheral region thereof without considerably lowering production efficiency, and to improve the yield of device chips produced from a single silicon wafer.

DISCLOSURE OF THE INVENTION

In order to solve the above-mentioned problems, the invention described in claims 1 and 2 is a silicon single-crystal wafer having a diameter of 6 inches or larger, characterized in that the wafer has no crystal defects with regard to the dielectric breakdown strength of oxide film in its peripheral region which extends from the circumference of the wafer and accounts for up to 50% of the total area, in particular which extends from the circumference of the wafer to a circle 30 mm away from the circumference.

By making a wafer free of defects in its peripheral region which has a significant effect on the yield of device chips, which extends from the circumference of the wafer and accounts for up to 50% of the total area, in particular which extends from the circumference to a circle 30 mm away from the circumference, the dielectric breakdown strength of oxide film in the region is improved to thereby improve the yield of device chips produced from a single silicon wafer.

The invention described in claims 3 and 4 is a silicon single-crystal wafer having a diameter of 6 inches or larger, characterized in that the wafer has no defects in its peripheral region which extends from the circumference of the wafer and accounts for up to 50% of the total area, in particular which extends from the circumference to a circle 30 mm away from the circumference, and that the oxygen concentration in the wafer is not higher than 17 ppma.

By making a wafer free of defects in its peripheral region which has a significant effect on the yield of device chips, which extends from the circumference of the wafer and accounts for up to 50% of the total area, in particular which extends from the circumference of the wafer to a circle 30 mm away from the circumference, the dielectric breakdown strength of oxide film in the region is improved. Also, through establishment of an oxygen concentration not higher than 17 ppma, the occurrence of OSF (oxidation-induced stacking fault) is suppressed. Thus, the yield of device chips produced from a single silicon wafer is further improved.

The invention described in claim 5 is a process for producing a silicon single crystal by the Czochralski method, characterized in that the silicon single crystal is pulled at a rate which is 80 to 60% of the critical pull rate inherent in a pulling apparatus.

Through employment of such a process, a wafer can be made free of defects in its peripheral region which extends from the circumference of the wafer and accounts for up to 50% of the total area, in particular which extends from the circumference of the wafer to a circle 30 mm away from the circumference. Thus, there can be produced the above-mentioned silicon single-crystal wafer improved in the dielectric breakdown strength of oxide film as described in claims 1 to 4.

That is, according to the present invention, a wafer can be made free of crystal defects such as FPD and LSTD, which would otherwise degrade the dielectric breakdown strength of oxide film, in its peripheral region which extends from the circumference of the wafer and accounts for up to 50% of the total area, in particular which extends from the circumference of the wafer to a circle 30 mm away from the circumference. The peripheral region which extends from the circumference of a wafer to a circle, for example, 30 mm away from the circumference accounts for 60% or more of the total area in the case of a 6-inch wafer or 50% or more of the total area in the case of an 8-inch wafer. Accordingly, the yield of device chips obtained from a single wafer is improved.

According to the present invention, defect density can be reduced not only in the peripheral region of a wafer but also in the inner region of a wafer located inside the peripheral region as compared to the case of a conventional crystal. This feature, together with attainment of a defect-free peripheral region, enables a drastic improvement in the yield of device chips obtained from a single silicon wafer.

Further, in production of the above-mentioned wafer of the present invention, a single crystal may be pulled at a rate which is 80 to 60% of the critical pull rate inherent in a pulling apparatus. Thus, a silicon single-crystal wafer improved in the dielectric breakdown strength of oxide film can be easily obtained without considerably lowering production efficiency.

BRIEF DESCRIPTION OF THE DRAWINGS

FIG. 1A is a graph for a 6-inch wafer, and FIG. 1B is a graph for an 8-inch wafer.

FIG. 2A shows an example of a conventional furnace structure, and FIG. 2B shows an example of a conventional apparatus that adapted to make a grown crystal less cooled.

BEST MODE FOR CARRYING OUT THE INVENTION

The present invention will next be described in detail. Prior to the description, terms will be explained.

1) FPD (Flow Pattern Defect): After a wafer is sliced from a grown silicon single-crystal ingot, a damaged layer is removed from the surface of the wafer through etching with a mixed solution of hydrofluoric acid and nitric acid. Subsequently, the wafer surface is etched with a mixed solution of $K_2Cr_2O_7$, hydrofluoric acid, and water, so that together with pits, ripple patterns are generated in the surface of the wafer. This ripple patterns are called FPD. As FPD density in the wafer surface becomes higher, defects with regard to the dielectric breakdown strength of oxide film increase (Japanese Patent Laid-Open (kokai) No. 4-192345).

2) LSTD (Laser Scattering Tomography Defect): After a wafer is sliced from a grown silicon single-crystal ingot, a damaged layer is removed from the surface of the wafer through etching with a mixed solution of hydrofluoric acid and nitric acid. Subsequently, the wafer is cleaved, and infrared light is introduced into the wafer through the cleavage plane. Then, light exiting from the wafer surface is observed. Thus, light scattered due to defects within the wafer is detected. The scattering defect detected in this observation has already been reported at a meeting of an academic society or the like and is considered to be an oxide precipitate (see J.J.A.P. vol. 32, p.3679, 1993).

Since the density of FPD or LSTD strongly interrelates with failure rate regarding the dielectric breakdown strength of oxide film, FPD and LSTD are both considered degrading factors of the dielectric breakdown strength of oxide film. The inventors of the present invention studied the distribution of these defects in the wafer surface and found the following: in a wafer produced by a conventional method in which a silicon single crystal is pulled at a near critical pull rate, substantially no defects are present in the peripheral region which extends from the circumference of the wafer to a circle about 5 mm away from the circumference, and defects are substantially uniformly distributed in the remainder of the wafer surface. Thus, the present inventors confirmed that the characteristic of the dielectric breakdown strength of oxide film was substantially uniformly distributed over the wafer surface.

Figure 1A:
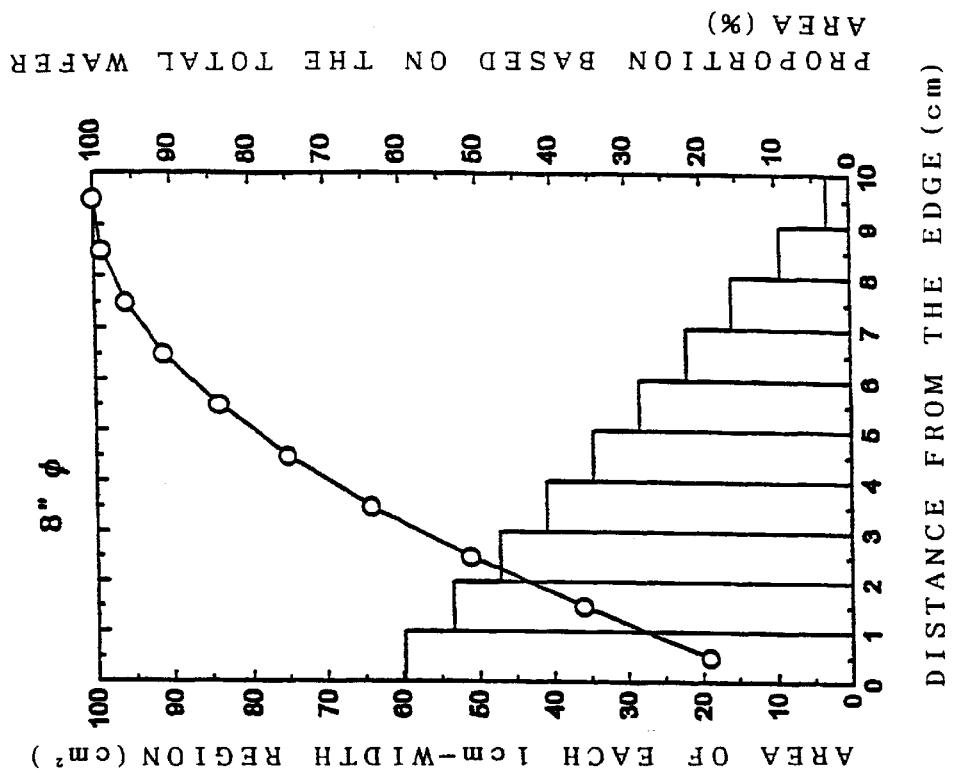
FIGS. 1A and 1B are graphs showing the relation, in a single wafer, between the distance of a region from the circumference of the wafer and the proportion of the area of the region.
Figure 1B:
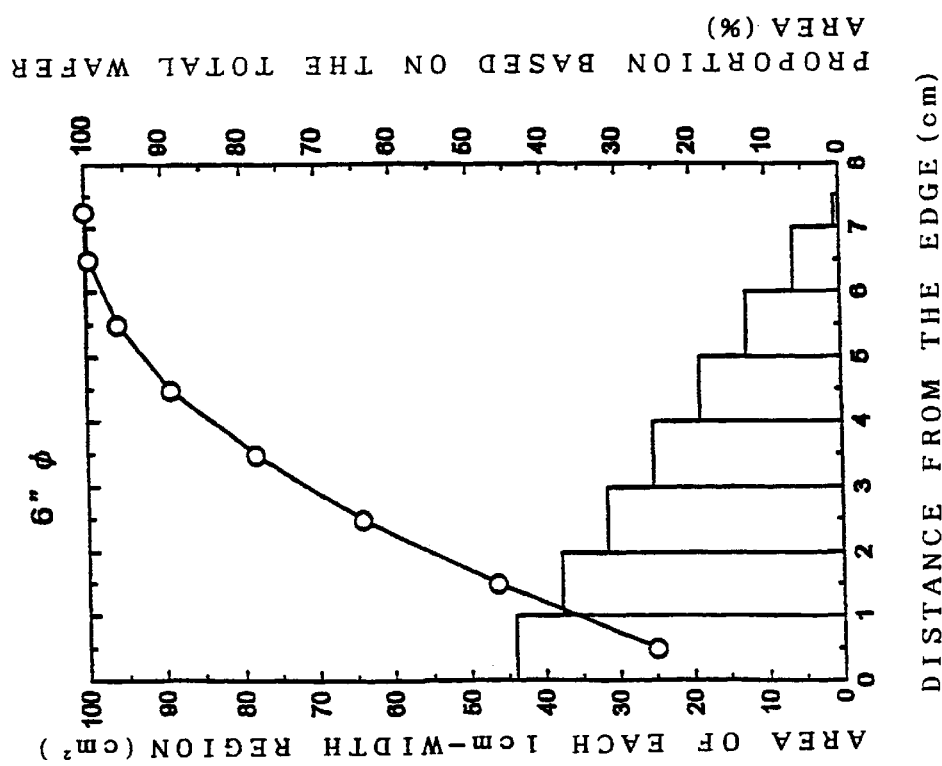

However, in a single wafer, its peripheral region accounts for larger portion of the total area. For example, as shown in FIGS. 1A and 1B, the peripheral region which extends from the circumference of the wafer to a circle 30 mm away from the circumference accounts for 60% of the total area or more in the case of a 6-inch wafer and 50% or more in the case of an 8-inch wafer. Accordingly, the peripheral region has a relatively strong effect on the yield of device chips. Therefore, in order to improve the yield of device chips, a wafer must be improved in the dielectric breakdown strength of oxide film in the peripheral region which accounts for up to 50% of the total area. In view of this, the inventors of the present invention studied how a wafer must be improved in the dielectric breakdown strength of oxide film in the peripheral region which extends from the circumference of the wafer and accounts for up to 50% of the total area, in particular which extends from the circumference of the wafer to a circle 30 mm away from the circumference. In other words, the inventors studied how a wafer must be improved with regard to the above-mentioned FPD and LSTD in the peripheral region which extends from the circumference of the wafer and accounts for up to 50% of the total area, in particular which extends from the circumference of the wafer to a circle 30 mm away from the circumference. As a result, the inventors achieved the present invention.

Specifically, the inventors of the present invention confirmed the following from the experimental result of growth of a single crystal which was conducted at various pull rates (various rates of growing a single crystal) through use of the same pulling apparatus and the same furnace structure: through the reduction of the pull rate to 80% or less of the critical pull rate inherent in the pulling apparatus, the single crystal has no defects in its peripheral region which extends from its circumference and accounts for 50% or more of the total area, in particular which extends from the circumference to a circle 30 mm or more away from the circumference.

Herein, the critical pull rate is an average rate of pulling a single crystal (an average rate of growing a single crystal) and denotes a rate, above which a grown crystal ingot deforms with a resultant failure to maintain a cylindrical shape. The critical pull rate is inherent in a pulling apparatus and in the furnace structure of the pulling apparatus, and thus depends on individual pulling apparatus or, even in the case of the same pulling apparatus, individual furnace structures.

The critical pull rate is obtained in the following manner: in several practices of growing single crystal ingots through use of the pulling apparatus concerned, an average growth rate is gradually increased stepwise after each pulling operation to find a growth rate at which a grown crystal ingot is deformed. Since the thus-obtained critical pull rate is inherent in a pulling apparatus and its furnace structure, the critical pull rate must be obtained for each pulling apparatus and for each furnace structure.

When a single crystal is grown at a pull rate not higher than 80% of the thus-obtained critical pull rate, the single crystal has no FPD or LSTD in its peripheral region which extends from its circumference and accounts for 50% or more of the total area, in particular which extends from its circumference to a circle 30 mm or more away from the circumference. By further lowering of the pull rate, the defect-free region expands, but the production efficiency of a single crystal drops accordingly, resulting in a significant increase in cost. Accordingly, a single crystal is preferably pulled at a rate which is 80 to 60% of the critical pull rate.

As a result of reduction of the pull rate to 60% of the critical pull rate, a single crystal has no defects in its peripheral region which extends from its circumference and accounts for 50% or more of the total area, in particular which extends from its circumference to a circle 30 mm or more away from the circumference. As mentioned previously, since the peripheral region accounts for half or more of the total area of a single wafer, the yield of device chips is significantly improved. Moreover, according to experiments conducted by the inventors of the present invention, by pulling a single crystal at a rate which is 80 to 60% of the critical pull rate, not only does the single crystal have no defects in its peripheral region which extends from its circumference and accounts for up to 50% of the total area, in particular which extends from its circumference to a circle 30 mm away from the circumference, but also the single crystal shows a significant reduction in defect density even in its inner region located inside the peripheral region. Thus, the single crystal is significantly improved in the dielectric breakdown strength of oxide film even in its inner region. As a result, a wafer as a whole is significantly improved in the yield of device chips.

However, when the pull rate is reduced to 80% of the critical pull rate or lower, and the oxygen concentration in a single crystal is in excess of 17 ppma JEIDA (Japan Electronic Industry Development and Association), a ring-shape distributed OSF may be generated after heat treatment is conducted at a high temperature in an oxidizing atmosphere, even though the single crystal has no FPD or LSTD in its peripheral part. Since such an OSF causes a degradation in electric characteristics in the steps of fabricating devices, the oxygen concentration in a single crystal is preferably controlled at 17 ppma JEIDA or less in the process for producing a silicon single crystal of the present invention, i.e. a silicon single crystal with no crystal defect in the peripheral region of a wafer.

In order to control the oxygen concentration in a silicon single crystal at 17 ppma or less, a method which is generally carried out in the CZ method may be employed. Such an oxygen concentration level can be readily attained, for example, by rotating a crucible at a low speed, regulating temperature distribution within a furnace, or applying a magnetic field to a melt (so-called MCZ method).

A theory which explains how a wafer becomes free of defects in its peripheral part is not necessarily clear. In view of the conventional knowledge that FPD and LSTD are defects present in the so-called D region of a silicon single crystal and that these defects are present only inside ring-shape distributed OSF (Takao Abe, "Growth of Silicon Crystal and Wafer Processing," pp. 251-), as a result of reduction in the pull rate, latent nuclei of ring-shape distributed OSFs are present in the peripheral part of a wafer; therefore, FPD and LSTD are conceivably not observed in the peripheral region of a wafer which extends from the circumference of the wafer and accounts for 50% or more of the total area, in particular which extends from the circumference of the wafer to a circle 30 mm or more away from the circumference. When the oxygen concentration in a wafer is in excess of 17 ppma JEIDA, a heat treatment conducted at a high temperature and in an oxidizing atmosphere may cause latent nuclei of OSFs to be actualized in a ring-shape distribution.

Specifically, according to the present invention, latent nuclei of ring-shape distributed OSFs are formed and in the peripheral region of a single crystal which extends from the circumference of the single crystal and accounts for up to 50% of the total area, in particular which extends from the circumference to a circle 30 mm away from the circumference; thus, FPD and LSTD, which are crystal defects called D defects and cause degradation in the dielectric breakdown strength of oxide film, are not formed in the peripheral region. When the oxygen concentration in a silicon single crystal is not higher than 17 ppma, the latent nuclei of OSFs are not actualized, and thus do not cause any problem to apparatus operation; consequently, there can be produced a silicon single-crystal wafer with no crystal defect in the peripheral region thereof.

An embodiment of the present invention will next be described in detail with reference to the drawings.

Figure 2A:
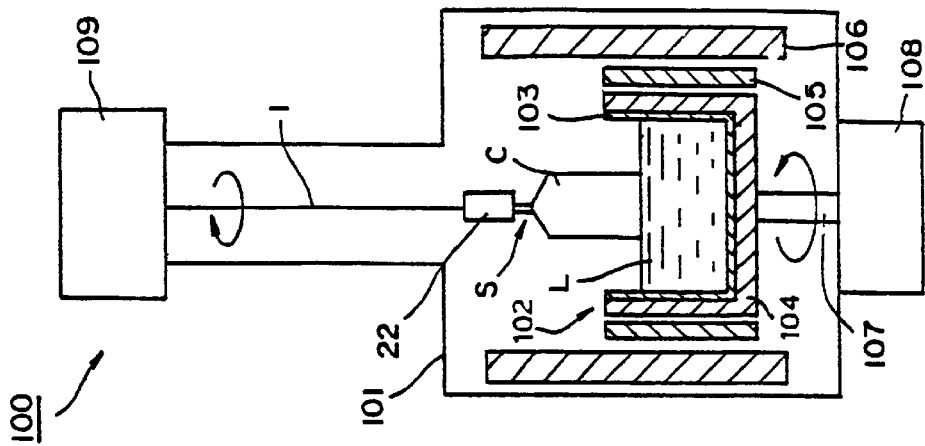
FIGS. 2A and 2B are schematic sectional views showing a pulling apparatus for producing a single crystal by the CZ method.

First, an example of the structure of a conventional single crystal pulling apparatus which employs the CZ method will be described with reference to FIG. 2A. As shown in FIG. 2A, a single crystal pulling apparatus 100 includes a chamber 101, a crucible 102 provided in the chamber 101, a heater 105 disposed around the crucible 102, a crucible-holding shaft 107 and rotating mechanism 108 for rotating the crucible 102, a seed chuck 22 for holding a silicon seed crystal S, a cable 1 for lifting the seed chuck 22, and a winding mechanism 109 for rotating or winding up the cable 1. A quartz crucible 103 is provided on the inner side of the crucible 102 so as to accommodate a melt L, and a graphite crucible 104 is provided on the outer side of the quartz crucible 103. A heat-insulating material 106 is disposed around the outer side of the heater 105. Further, a flow guide cylinder (not shown) may be provided so as to surround a grown single crystal C in order to guide a gas flow within the furnace and effectively discharge a reaction gas, such as SiO, generated within the furnace. Recently, the so-called MCZ method is frequently used in which an unillustrated magnet or coil is disposed around the outer side of the chamber 101 so as to apply to the silicon melt L a magnetic field in a horizontal or vertical direction, or so-called cusp magnetic field, thereby suppressing convection of the melt L for the purpose of stably growing a single crystal.

Next will be described a process for growing a single crystal through use of the above-described single crystal pulling apparatus 100.

First, a high-purity polycrystalline material of silicon is heated to its melting point (approx. 1400° C.) or higher and melted in the crucible 102. Next, the cable 1 is unwound so as to bring the tip of the seed crystal S in contact with or immerse in the melt L substantially at the central portion of the surface of the melt L. Subsequently, the crucible-holding shaft 107 is rotated in an appropriate direction, and the cable 1 is wound up while being rotated so as to pull the seed crystal S, thereby starting to grow a single crystal. Subsequently, through adequate adjustment of the pull rate and temperature, a substantially cylindrical single-crystal ingot C is obtained.

In this case, in order to lower the pull rate to 80 to 60% of the critical pull rate as in the case of the present invention, power to be supplied to the heater 105 may be increased so as to slightly increase the temperatures of the melt L and the grown crystal C. When the temperatures of the melt and the crystal are slightly increased, the single crystal C becomes unable to maintain a set diameter. Thus, by lowering the pull rate below a conventional level, the amount of latent heat of crystallization per unit time is decreased to thereby maintain the diameter of the single crystal C at a predetermined value. Through adequate adjustment of the pull rate and temperature as conducted as above, an average pull rate can be adjusted to 80 to 60% of the critical pull rate as in the case of the present invention.

Figure 2B:
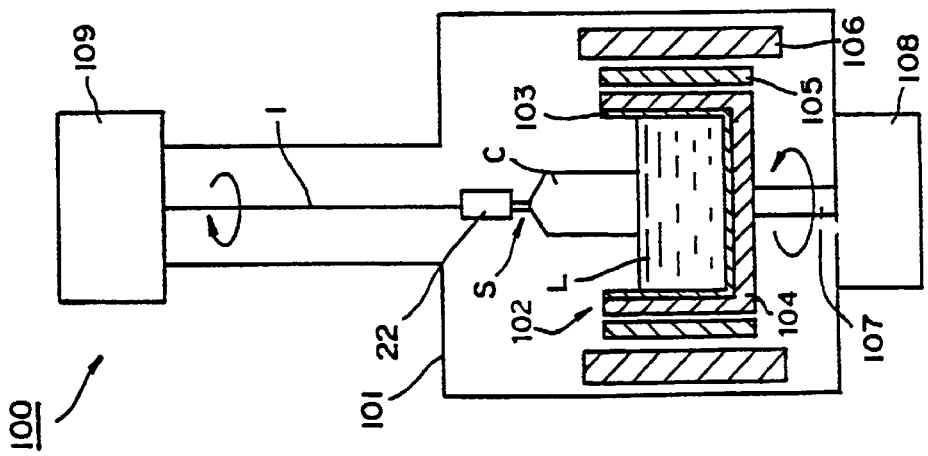

In the case of a pulling apparatus and a furnace structure as shown in FIG. 2A, for example, and when a silicon single crystal having a diameter of 6 inches is grown through use of an 18-inch quartz crucible, the critical pull rate ranges approximately between 1.0 and 1.6 mm/min, although it may depend on various other factors such as other furnace members. In this case, when the insulating material 106 of FIG. 2A is extended upward as shown in FIG. 2B so that the grown single crystal C is less likely to be cooled, the critical pull rate decreases to approximately 0.6–1.2 mm/min.

The present invention will now be described by way of example.

EXAMPLE

Through use of the pulling apparatus and furnace structure as shown in FIG. 2A, a silicon single crystal was grown. Specifically, a polycrystalline silicon material was charged into an 18-inch quartz crucible in an amount of 50 kg. A silicon single-crystal ingot having a diameter of 6 inches and orientation <100> was grown at various average pull rates.

First, the pull rate was set at a possible highest level so as to confirm a rate at which a crystal begins to deform, to thereby obtain the critical pull rate inherent in the pulling apparatus having the illustrated furnace structure. The critical pull rate was an average of 1.2 mm/min (length of straight portion of single-crystal ingot: about 80 cm).

Next, a silicon single-crystal ingot was grown at each of various average pull rates, specifically 100%, 90%, 80%, and 70% of the critical pull rate obtained above.

These single-crystal ingots were sliced to obtain wafers. The thus-obtained wafers were mirror-polished to obtain silicon single-crystal mirror wafers.

The thus-obtained silicon single-crystal mirror wafers were measured for the aforementioned FPD and LSTD. The result is represented by the graphs of FIG. 3 (FPD) and FIG. 4 (LSTD).

Figure 3:
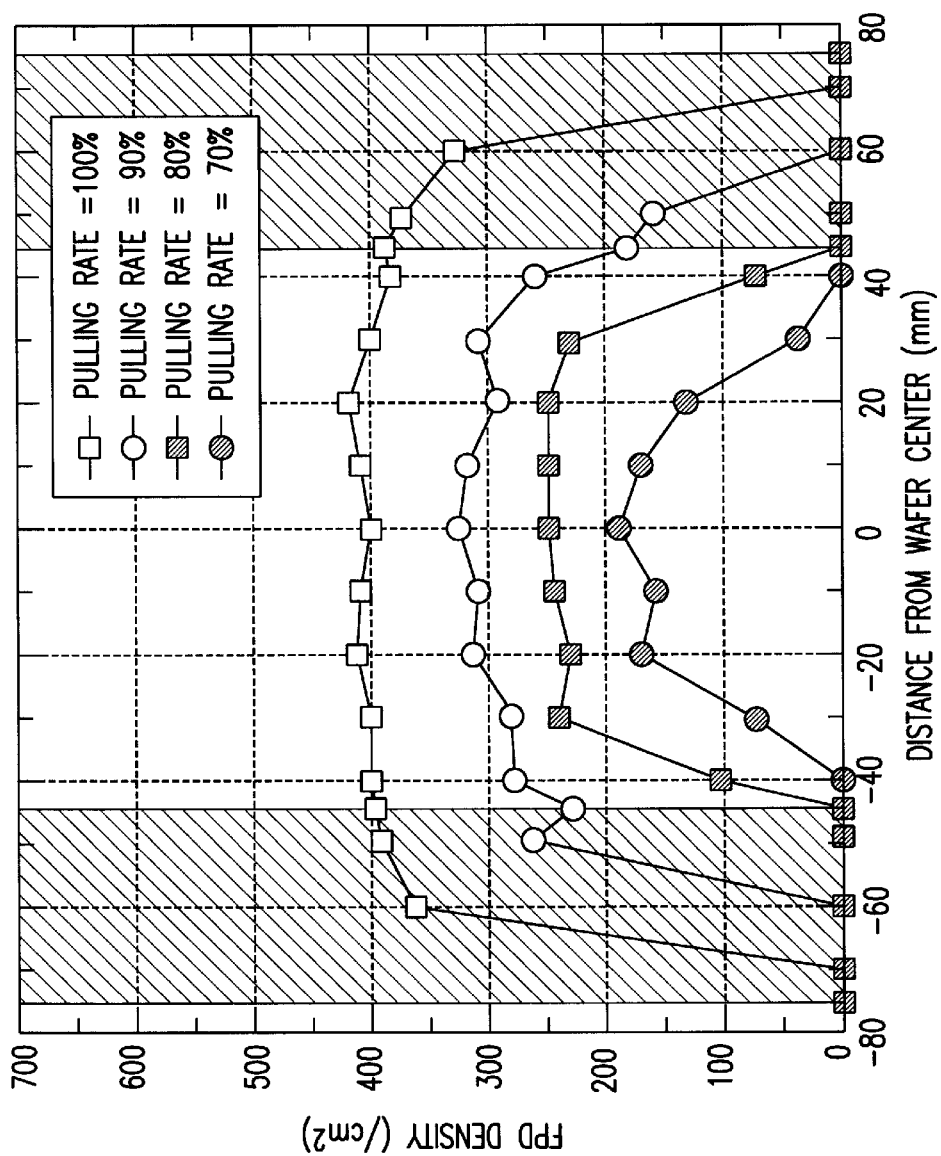
FIG. 3 is a graph showing the density distribution of FPD defects in a wafer surface as measured with various pull rates as parameters.
Figure 4:
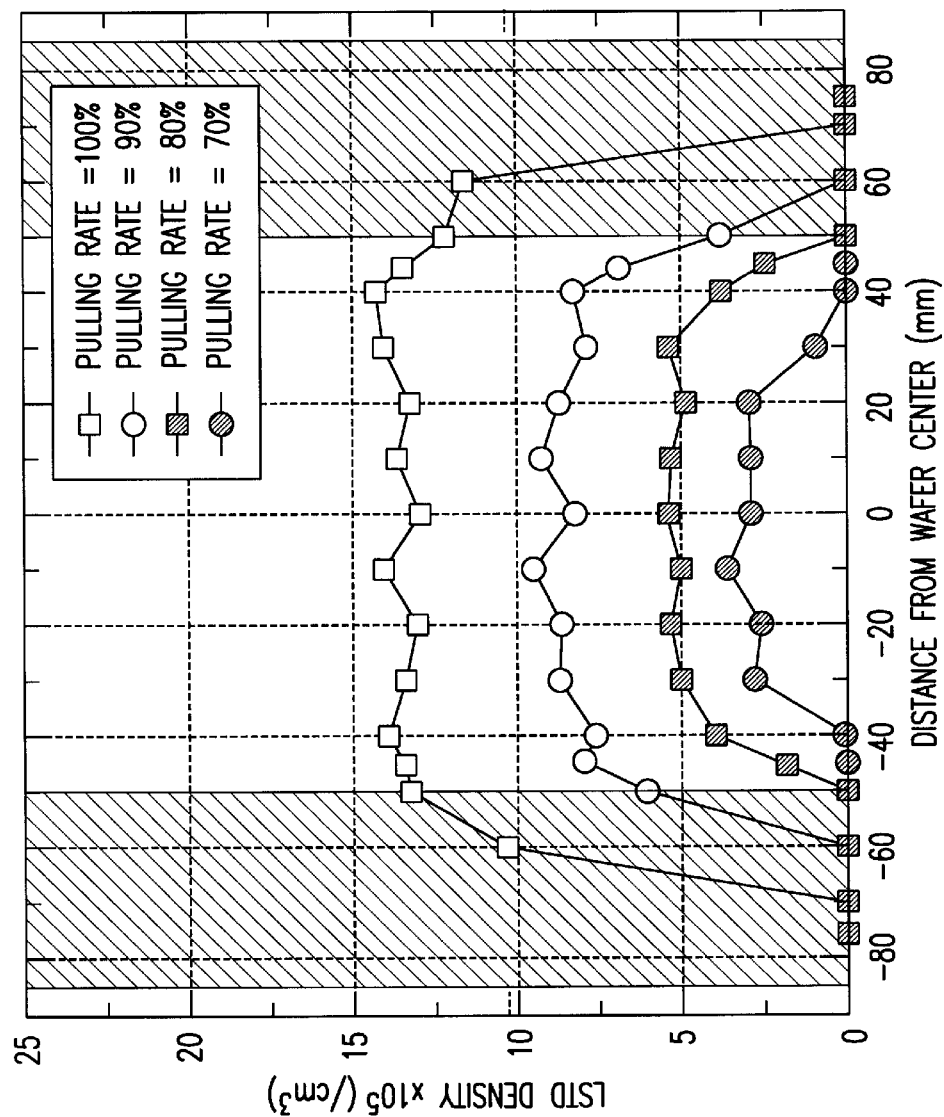
FIG. 4 is a graph showing the density distribution of LSTD defects in a wafer surface as measured with various pull rates as parameters.

As seen from FIGS. 3 and 4, as the pull rate decreases from the critical pull rate, a defect-free region gradually expands in the peripheral region of a wafer. Particularly, at a pull rate which is 80% of the critical pull rate or lower, a wafer has no defects in its peripheral region which extends from the circumference of the wafer to a circle 30 mm away from the circumference.

Further, as the pull rate is decreased, the defect-free part expands in the peripheral region of a wafer, and defects decrease in the central part of a wafer. Particularly, at a pull rate which is 80% of the critical pull rate or lower, a significant improvement is observed with regard to defect density. Specifically, defect density is approximately less than halves as compared to that of a conventional crystal which is grown at the critical pull rate or near critical pull rate.

Thus, when devices are produced from such a silicon single-crystal wafer, the wafer shows a yield of about 100% in its peripheral region and a significant improvement in yield in its central part as compared to the case of a conventional wafer.

The present invention is not limited to the above-described embodiment. The above-described embodiment is a mere example, and those having the substantially same structure as that described in the appended claims and providing the similar action and effects are included in the scope of the present invention.

For example, the above embodiment is described while mentioning the production of a silicon single crystal having a diameter of 6 inches or 8 inches. However, the present invention is not limited thereto, and the similar action and effects may be provided in the production of a silicon single crystal having a diameter of 10 to 16 inches or larger.

What is claimed is:

1. A silicon single-crystal wafer having a diameter of 6 inches or larger, wherein the wafer has no defects in its peripheral region which extends from the circumference of the wafer and accounts for up to 50% of the total area, and the oxygen concentration in the wafer is not higher than 17 ppma.

2. A silicon single-crystal wafer having a diameter of 6 inches or larger, wherein the wafer has no defects in its peripheral region which extends from the circumference to a circle 30 mm away from the circumference, and the oxygen concentration in the wafer is not higher than 17 ppma.

* * * * *